United States Patent
Ma et al.

[11] Patent Number: 6,004,838
[45] Date of Patent: Dec. 21, 1999

[54] ESD PROTECTION USING SELECTIVE SILICIDING TECHNIQUES

[75] Inventors: Manny K.F. Ma; Aaron Schoenfeld, both of Boise, Id.

[73] Assignee: Micron Technology, Inc., Boise, Id.

[21] Appl. No.: 09/031,324

[22] Filed: Feb. 26, 1998

Related U.S. Application Data

[63] Continuation of application No. 08/661,447, Jun. 11, 1996, Pat. No. 5,744,839.

[51] Int. Cl.$^6$ .................................................. H01L 21/8238
[52] U.S. Cl. ......................... 438/200; 438/233; 438/586
[58] Field of Search ................................. 438/200, 233, 438/275, 586, 592, 655, 656

[56] References Cited

U.S. PATENT DOCUMENTS

| | | | |
|---|---|---|---|
| 5,021,853 | 6/1991 | Mistry | 357/23.13 |
| 5,144,518 | 9/1992 | Miyazaki | 361/56 |
| 5,218,222 | 6/1993 | Roberts | 257/362 |
| 5,293,057 | 3/1994 | Ho et al. | 257/356 |
| 5,336,908 | 8/1994 | Roberts | 257/173 |
| 5,404,041 | 4/1995 | Diez et al. | 257/360 |
| 5,413,969 | 5/1995 | Huang | 438/586 |
| 5,468,667 | 11/1995 | Diaz et al. | 438/586 |
| 5,620,920 | 4/1997 | Wilmsmeyer | 438/233 |

*Primary Examiner*—Chandra Chaudhari
*Attorney, Agent, or Firm*—Schwegman, Lundberg Woessner & Kluth P.A.

[57] ABSTRACT

The present invention relates to methods and apparatus for manufacturing semiconductor devices, and in particular for forming electrostatic discharge (ESD) protection devices, using selective siliciding, in a CMOS integrated circuit. Predetermined discharge paths are created for discharging input and output buffer pads, during an ESD event, through ESD protection devices. During fabrication, an oxide layer is utilized as a mask to prevent silicided regions from forming in source/drain regions, self-aligned with the gates. The buffer transistor gate-to-contact spacing is made longer than the gate-to-contact spacing in the associated protection transistor, to shunt charge through the protection device. In a further embodiment, active area resistance is formed between the output/input buffer transistor and the ESD protection device, to further increase the resistance of the path between the buffer pad to the associated buffer transistor.

12 Claims, 6 Drawing Sheets

ESD PROTECTION USING SELECTIVE SILICIDING TECHNIQUES

This application is a continuation of U.S. patent application Ser. No. 08/661,447, filed Jun. 11, 1996 (the '447 Application) and now U.S. Pat. No. 5,744,839. The '447 Application is incorporated herein by reference.

FIELD OF THE INVENTION

The present invention relates to methods and apparatus for manufacturing semiconductor devices, and in particular for forming output/input electrostatic discharge protection devices for an integrated circuit.

BACKGROUND OF THE INVENTION

Gates of metal-oxide-semiconductor (MOS) transistors receive input signals and transfer output signals in the form of a voltage. The gate oxide can break down if the applied voltage exceeds certain levels. Such excess voltages are often the result of human-operator or mechanical handling operations. Triboelectricity is an electrical charge which evolves when two materials are rubbed together. Human-operators create this type of electricity by walking across a room or by removing an integrated circuit (IC) from its plastic package. Triboelectricity results in a high voltage, which when applied to the pins of an IC package in the form of electrostatic discharge (ESD) can cause breakdown of the gate oxide or overheating due to overcurrent. Such breakdown may cause immediate or expedited destruction of transistors or other devices.

In order to combat problems associated with ESD events, manufacturers of MOS devices design protection devices that provide paths through which to discharge nodes rapidly. Protection devices may be applied between the input buffer or output buffer pads of a device and the respective gates to which they are connected. During an ESD event, a typical protection transistor enters snap-back, a low resistance regime in which large amounts of current are conducted.

Certain processing enhancements, such as siliciding source/drain regions, increase the performance of small-dimension devices, but often negate the benefits of ESD protection. Gate-controlled breakdown structures are easily degradable by silicided (especially self-aligned, silicided, also known as salicided) source/drain regions. Such silicided regions easily melt, or agglomerate, during an ESD event due to their close proximity to the reverse-biased junction (the drain of the MOS transistor in snap-back) edge, which is a source of heat during an ESD event. Attempts have been made to increase the gate-to-contact spacing in ESD protection devices, placing the silicide farther away from the heat-generating area in attempts to minimize the possibility of silicide failure. However, the problem with this solution is that this increased length adds resistance that impedes current which discharges through it. Thus, current tends to flow through the n-channel devices of output buffers first, negating the benefits of the protection device.

Another problem associated with silicided source/drain regions in a protection device is known as the "ballasting" effect. Due to the greatly reduced resistance of silicided regions during an ESD event, the current discharging through the protection device may collapse into a thin filament. This leads to increased heating and earlier device failure.

U.S. Pat. No. 5,021,853 to Mistry teaches an ESD MOS protection device formed by a salicide process. As shown in the prior art FIGS. 1A and 1B, the ESD protection device 11 is formed in part of an IC 10 by an n-channel grounded-gate transistor 11. This device has an output buffer circuit consisting of an n-channel ESD protection transistor 11, an n-channel pull-down transistor 12, and a p-channel pull-up transistor 13. The chip consists of a p(−) epitaxial layer 15 formed on a p(+) substrate 14. P-channel transistors 13 on the chip are formed in n-wells 17 in the epitaxial layer 15. N(+) source/drain regions 18, 19 for the n-channel transistors 12 and for the ESD transistors 11 are implanted into the epitaxial layer 15 and p(+) source/drain regions 21 for the p-channel transistors 13 are implanted into the n-well region 17. Transistor gates 20, 22, 23 are formed of polysilicon overlying a thin gate oxide layer and the channel regions between the source/drain regions 18, 19, 21. The use of sidewall spacers 24, 25 on the sides of the pull-up/pull-down transistors' 12, 13 polysilicon gates 22, 23 provides for self-alignment of the silicided contact areas 26, 27 on the source/drain regions 18, 21. Silicide 28, 29 is also formed on top of the pull-up/pull-down transistors' polysilicon gates 22, 23.

Figure 1A:
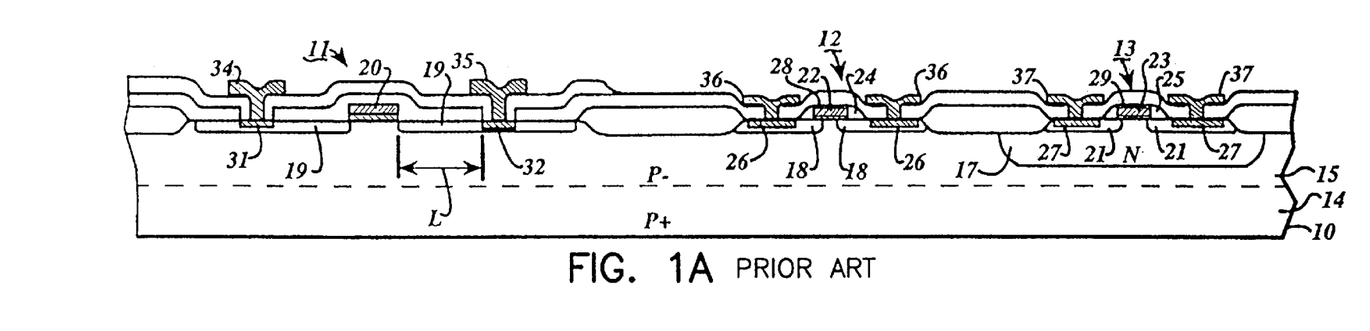
FIG. 1A is a cross-sectional representation of a prior-art MOS ESD-protected IC, taken along the line 1A—1A of FIG. 1B.
Figure 1B:
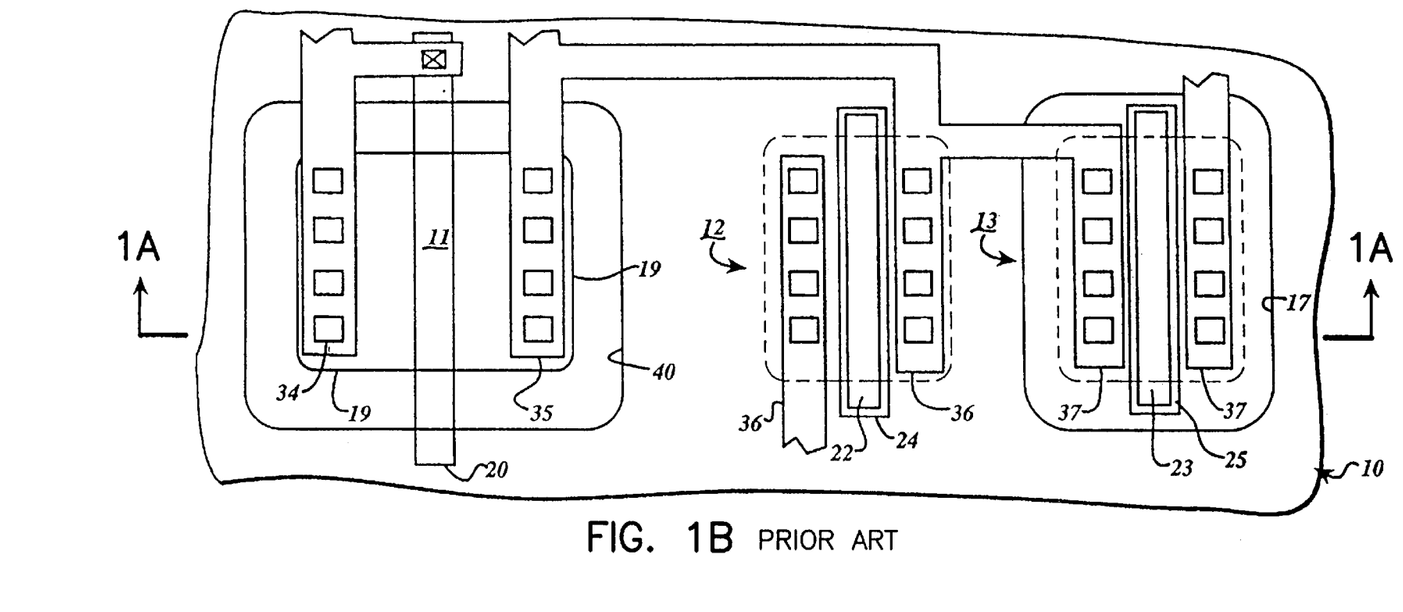
FIG. 1B is a planar view of the prior-art MOS ESD-protected integrated circuit illustrated in FIG. 1A.

Unlike the other p-channel and n-channel devices, the ESD protection transistor 11 does not have silicided areas on top of the polysilicon gate region 20, nor does it have silicide on the source/drain regions 19 near the gate 20 and self-aligned with the gate 20. Mistry places the silicided source/drain regions 31, 32 of the protection device 11 farther away from the gate 20. While this technique works to minimize silicide failure in the protection device, which leads to its early failure, it does not address the issue that the n-channel device 13 of the output buffer will turn on before the protection device 11 has a chance to shunt the charge away from the internal circuitry. Metal contacts 34, 35, 36, 37 are deposited on top of the silicided source/drain regions 31, 32, 26, 27 in order to connect the devices in the desired circuit configuration. The reason why the n-channel device 13 of the output buffer will turn on first is that its path is less resistive than that through the protection device. By requiring that the gate-to-contact spacing, L, of the protection device 11 be longer than the gate-to-contact spacing of the other transistors in the IC, Mistry creates more resistance in the protection device 11. Thus, current travels through the n-channel device 13 of the output buffer first, where the resistance is lower.

There is a need for an ESD protection device in a MOS IC which prevents an n-channel device of an output buffer from turning on before all of the charge is shunted away through the protection device. There is a further need for preventing ESD charge from reaching input buffer transistors before all of the charge is shunted away through the protection device. Existing techniques do not address these problems. There is a further need for an ESD protection device which utilizes silicided regions in an effective manner, without utilizing salicide techniques, and which exhibit a decreased likelihood of failure. Furthermore, there is a need to increase resistance between output/input buffers of ICs and active devices in ways outside of adjusting the gate-to-contact spacing of structures, such as ESD protection and active devices. While such gate-to-contact spacings may be adjusted to bias discharge through the protection device, there are limitations to the amount of adjustment which is allowable when manufacturing.

SUMMARY OF THE INVENTION

Electrostatic discharge protection devices are formed without using saliciding techniques, in a CMOS integrated circuit. A predetermined discharge path is created for discharging a transistor, or other device, during an ESD event, through an ESD protection device. During fabrication, an oxide layer is utilized as a mask to prevent self-aligned, silicided (salicided) regions from forming in source/drain regions near output/input buffer transistor gates and ESD protection transistor gates. This oxide layer can be the same layer that creates sidewall spacers for other device transistors on the die, so it does not add steps to the fabrication process. By controlling spacing of silicided source/drain regions, silicided source/drain regions may still be used in ESD protection devices when spaced away from the gate and heat generating areas of the device.

Active device gate-to-contact spacing is made longer than the gate-to-contact spacing in the associated protection device. Thus, the discharge path through the protection device is much less resistive, greatly reducing the possibility of active devices turning on before charge is shunted away through the protection device.

A further embodiment of the invention utilizes active area resistance formed between the output/input buffer and the ESD device. Fabrication of this resistance is performed using the same masks and layers utilized in creating the other aspects of this invention, so that it does not add steps to the fabrication process.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Numbering in the Figures is usually done with the hundreds and thousands digits corresponding to the figure number, with the exception that the same components may appear in multiple figures. Signals and connections may be referred to by the same number or label, and the actual meaning should be clear from the context of use.

Figure 2:
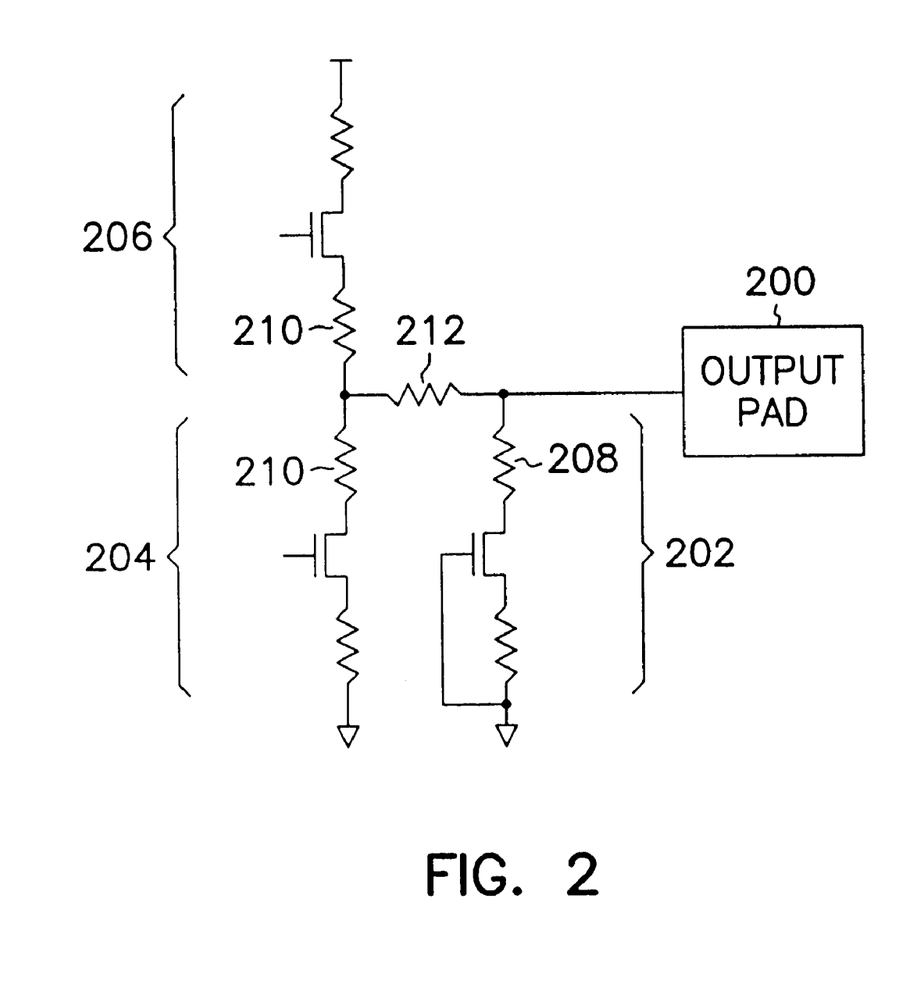
FIG. 2 is a schematic integrated circuit diagram illustrating an ESD protection device, an output buffer, and active pull-up/pull-down transistors.

FIG. 2 is a schematic integrated circuit (IC) diagram illustrating one embodiment of the invention, comprising an ESD protection transistor 202, an output buffer pad 200, and active pull-up/pull-down series coupled output buffer transistors 204 and 206. Transistors 202, 204, and 206 are connected in the circuit design shown in FIG. 2. The source of electrostatic charge is output buffer pad 200. There is an associated resistance with each transistor, which is dictated by gate-to-contact spacing in the transistor. The resistance associated with the ESD protection transistor is illustrated as 208. The resistance associated with the output buffer transistors 204 and 206 is identical and is illustrated as 210. The resistance of the ESD protection transistor is formed to be less than that of the buffer transistors 204 and 206. ESD protection transistor 202 is connected in parallel with the output buffer transistors 204 and 206. In other embodiments of the invention, either, or both, of the output buffer transistors 204 and 206 may be input buffer transistors and output buffer pad 200 may instead be an input buffer pad. Furthermore, both n-channel pull-down transistors and p-channel pull-up transistors may be used. Other circuitry on the die, such as DRAM memory cells and access circuitry or other devices are also protected by use of the present invention.

According to a further embodiment of the invention, active area resistance 212, as shown in FIG. 2, is created simultaneously with other active areas. The active area resistance 212 is proportional to the area of the oxide through which current must flow and is varied as desired. Active area resistance 212 is connected between the drains of the output buffer transistors 204 and 206 and the drain of the ESD protection device 202 in one embodiment, where the IC is connected to an output buffer pad 200. The combination of resistances in the circuit is such that the ESD protection device resistance 208 is less than the sum of the output buffer transistor resistances 210, or in the case of active area resistance 212, the sum of the output buffer transistor resistances 210 and the active area resistance 212.

FIGS. 3A–3F illustrate the steps used for the manufacture of an ESD protection device, which protects the output/input buffer transistors from electrostatic charges which originate in an output/input buffer. Such illustrations show only a small part of each chip and integrated circuit, but illustrate the steps necessary to achieve the objects of this invention. The method detailed below is described in reference to output buffers and output buffer transistors. However, the same description and method applies to input buffers and their respective input buffer transistors. The ESD protection devices for input buffers and transistors are formed at the same time as those for output buffers and transistors in one embodiment. In one embodiment, the gate to contact spacing of the protection device is determined first during design. Then the gate to contact spacing of the buffer transistors is determined as a function of the gate to contact spacing of the protection device.

Figure 3A:
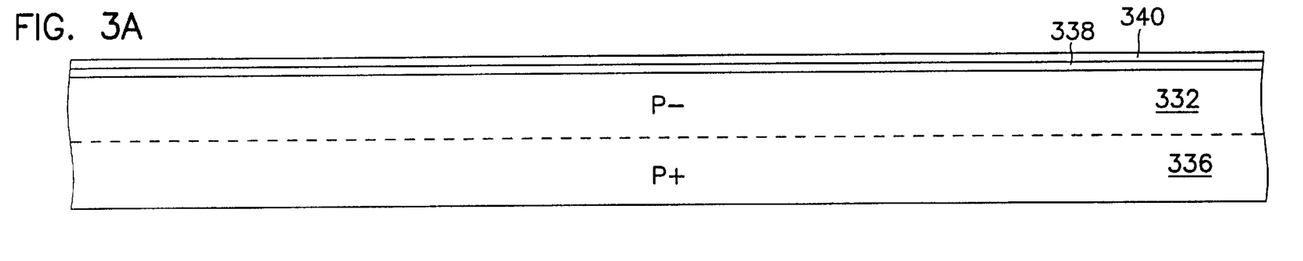
FIGS. 3A–3F are cross-sectional representations illustrating process steps utilized in fabricating an ESD protection device and active pull-up/pull-down transistors, in accordance with the present invention.
Figures 3B, 3C:
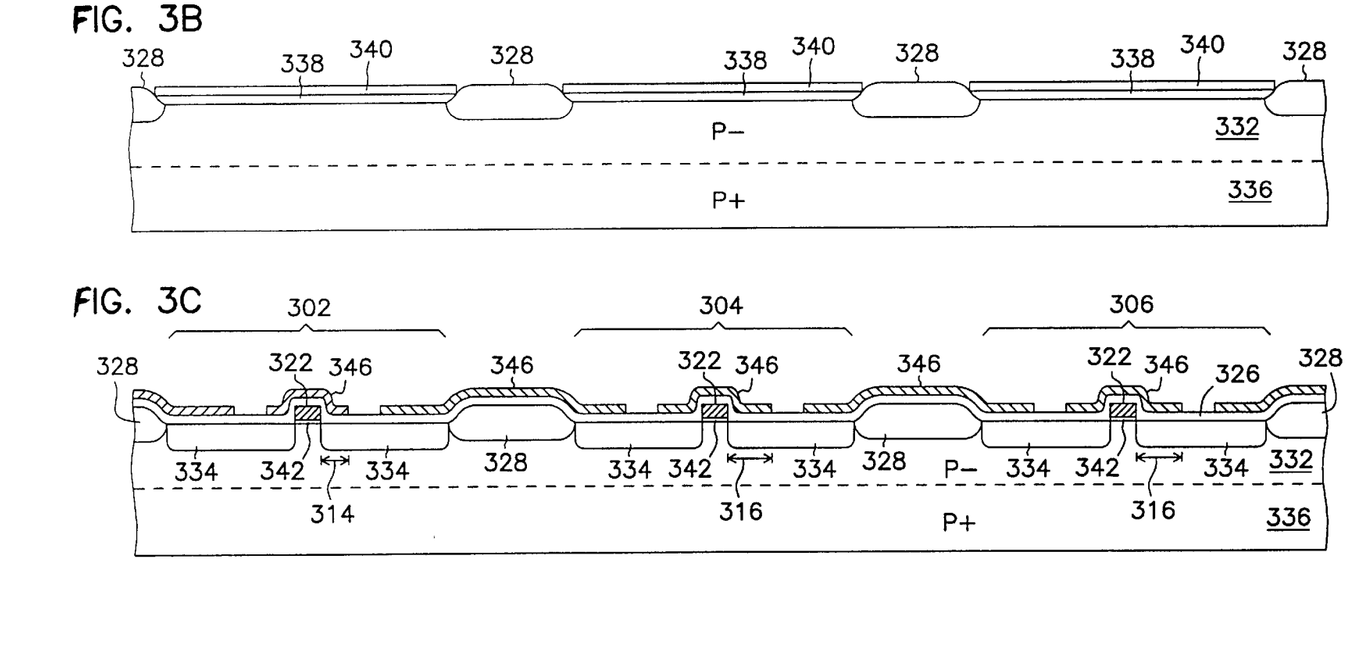

First, a (p−) epitaxial layer 332 is formed on a (p+) silicon substrate 336 in a manner well known in the art. A layer of silicon oxide 338 is then formed on the epitaxial layer 332 by thermal oxidation. The steps needed to form field oxide begin with depositing a silicon nitride layer 340 over the oxide layer 338, as shown in FIG. 3A. After patterning, using photolithographic mask and etch steps, oxide/nitride layers 338, 340 remain only on the active areas where the transistors are to be created. Thermally oxidizing the wafers creates field oxide 328 in non-active device areas, as shown in FIG. 3B. The remaining oxide/nitride layers 338, 340 are stripped in order to expose the (p−) epitaxial layer on which gate oxides 342 are created by thermal oxidation, as shown in FIG. 3C.

Next, gates 322 are created by depositing a layer of polycrystalline silicon over the entire wafer and patterning, using photolithographic mask and etch steps or other methods, to leave defined gates, as shown in FIG. 3C, over the gate oxide regions 342. A photoresist layer is then deposited on the wafer prior to formation of the source/drain regions and arsenic, or any similar n-type dopant, is implanted to create (n+) source/drain regions 334, as shown in FIG. 3C.

Figure 3D:
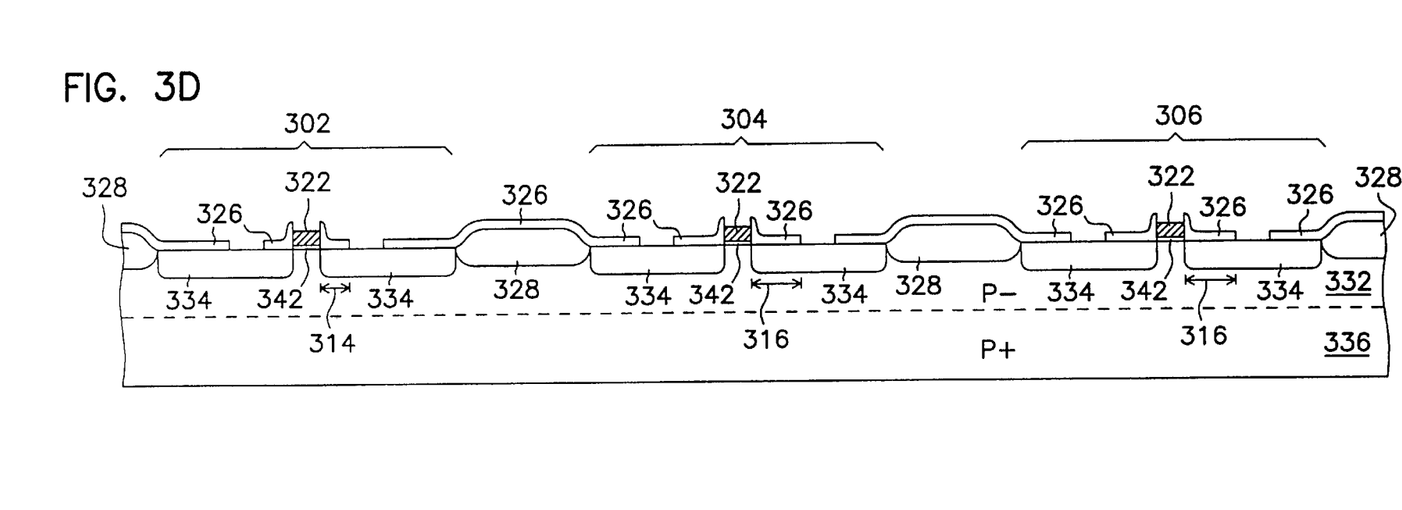

The photoresist mask is then stripped and the entire wafer is deposited with a low-temperature oxide 326, as shown in FIG. 3C. This low-temperature oxide controls formation of silicide on transistors 302, 304, 306 and is the same oxide which is used to create sidewall spacers for other device transistors on the die. A mask 346 is then formed over the wafer, as shown in FIG. 3C, and the oxide layer 326 is subsequently etched, leaving oxide 326 on selected areas, which are to be silicided, as shown in FIG. 3D. The mask precisely controls the gate-to-contact spacing 314 and 316 in fabricated transistors. The gate-to-contact spacing 314 of the ESD protection device transistor 302 is shorter than the gate-to-contact spacing 316 of the output buffer transistors 304 and 306 to provide a lower resistive path for discharge during an ESD event.

Figure 3E:
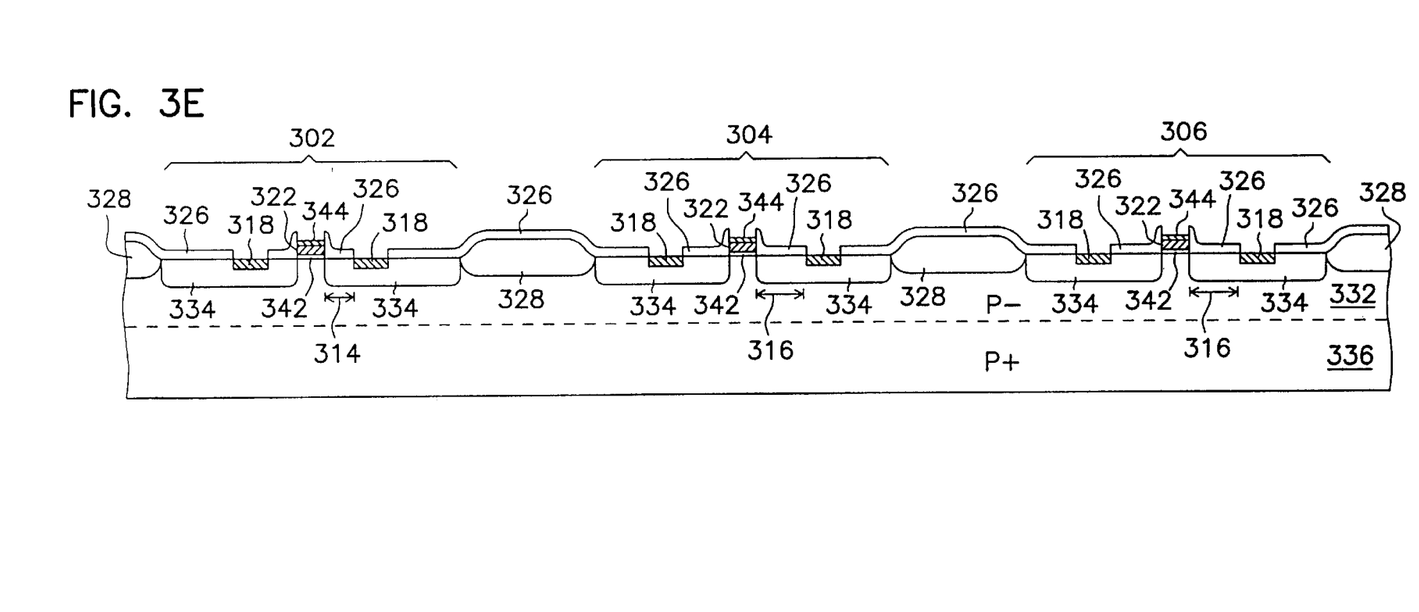

To form the silicided areas, a thin layer of a refractory metal, such as titanium, is deposited over the entire surface of the wafer. Annealing the wafer forms titanium silicide 318 and 344 in areas where the titanium is in contact with silicon. Then, excess titanium is removed, as shown in FIG. 3E. In further embodiments of the invention, titanium silicide, or another suitable refractory metal silicide, is deposited directly over the surface of the wafer. Then, excess silicide is removed, eliminating the need for an annealing step.

Figure 3F:
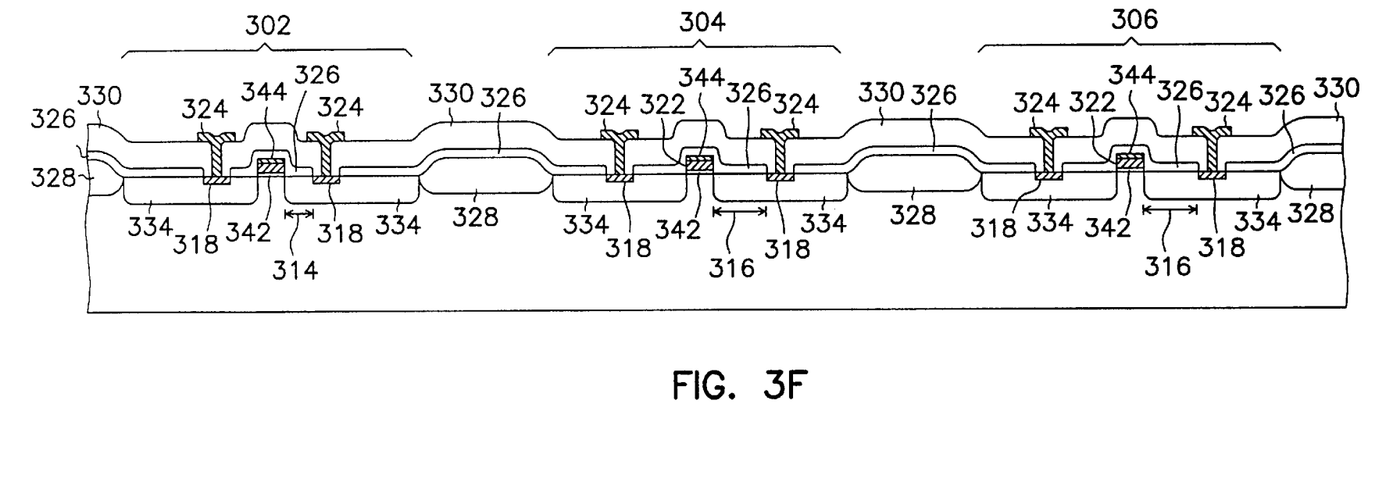

A thick layer of insulative material such as oxide 330 is then formed by deposition in a well known manner to cover and protect the devices. Subsequent photoresist masking and etching defines vias, where multiple contacts 324 are formed in direct electrical contact with the silicided source/drain regions 318, as shown in FIG. 3F. The contacts are metal in one embodiment, but may also be formed of other conductive materials in further embodiments.

Figure 3G:
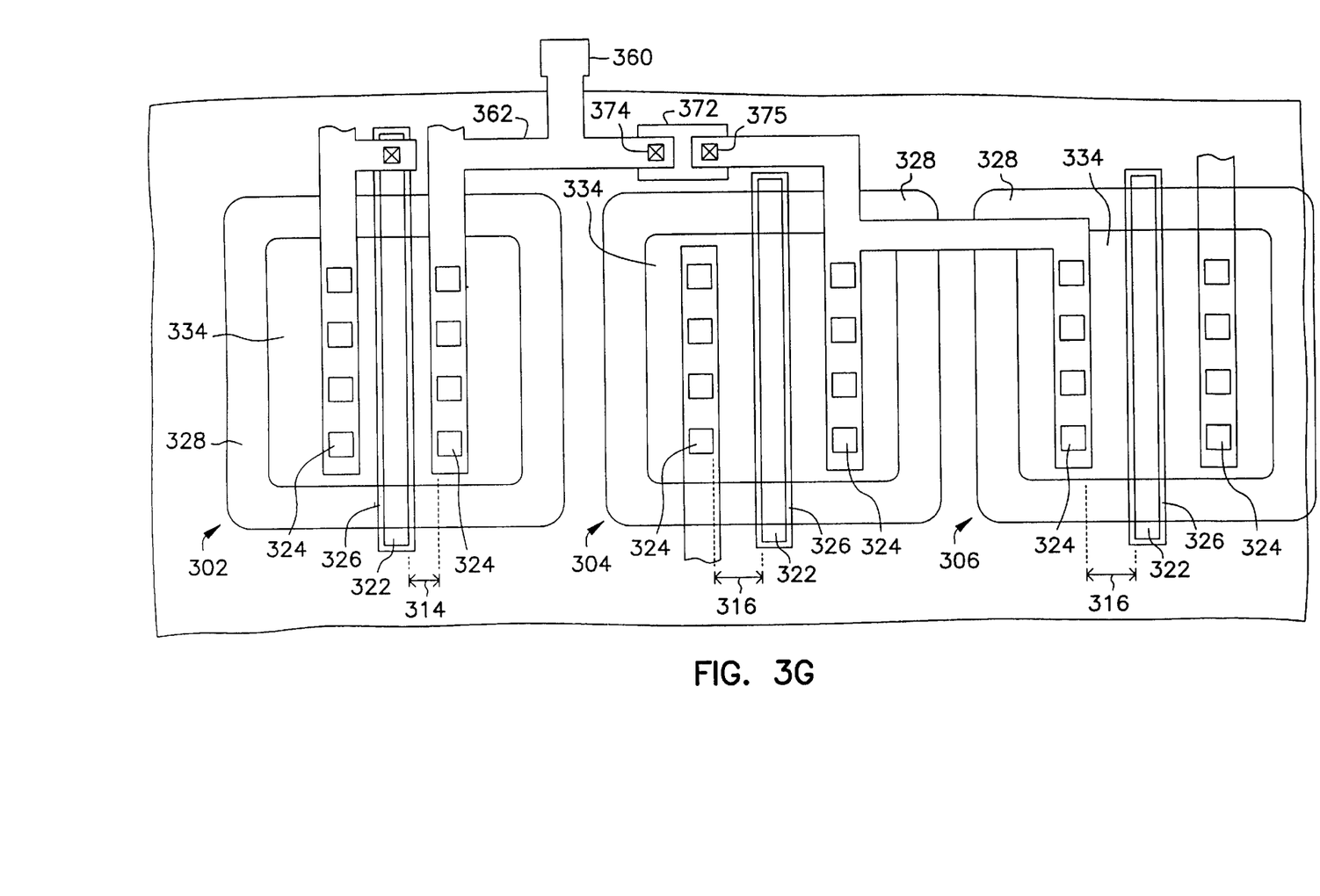
FIG. 3G is a planar view of the device of FIG. 3F.

Transistors 302,304,306, fabricated as detailed above, are connected via the forming of metal connectors, or metalization between contacts to underlying devices as shown in the circuit design in FIG. 2 and as shown in the planar view in FIG. 3G. The source of electrostatic charge is output buffer pad 200, indicated as 360 in FIG. 3G. The ESD protection device 302 is connected in parallel with the output buffer transistor via a conductor 362 which is formed on top of insulator 330. During operation, electrostatic charge discharges through ESD protection device 302, without turning on output buffer transistors 304, 306. In one embodiment, the gate-to-contact length 314 in the fabricated ESD protection transistor 302 is shorter than the gate-to-contact length 316 of the output buffer transistors 304, 306, as shown in FIG. 3F and 3G. These lengths are directly correlated with device resistance 208 and 210, as shown in FIG. 2. Thus, the ESD transistor resistance 208 is less than that of the output buffer transistors 210.

In a further embodiment of the invention, active area resistance 212, as shown in FIG. 2, comprises an n-well resistor 372 in FIG. 3G formed beneath conductor 362. As seen, conductor 362 has a break in it above resistor 372 such that current flows from a contact 374, through the well resistor, and back up to conductor 362 through a contact 375. The value of such resistance is easily selected by one skilled in the art to ensure that the output buffer transistors are protected from a desired range ESD events. The active area resistance 212, is connected between the drain of the output buffer transistor 204, 206 and the drain of the ESD protection device 202, in the case where the IC is connected to an output buffer pad 200, as shown in FIG. 2. These parts correspond to resistance 372, and transistors 304, 306 and 302 respectively in FIG. 3G.

It should be noted that in CMOS technology, many times certain areas of the semiconductor die described as having a particular doping, could quite easily be of a different doping, promoting a different type of charge carrier. In such instances, if one were to reverse the primary carriers in all areas of the die and adjust for carrier mobility, the invention would operate in the same manner as described herein without departing from the scope and spirit of the present invention. In addition, while precise process steps were identified to form the devices of the present invention, one skilled in the art can easily substitute equivalent processes to form the same structures. For example, photolithography may be replaced by laser or x-ray lithography.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for forming an ESD protection device on a semiconductor substrate, for protecting circuitry in a CMOS integrated circuit, comprising the steps of:

forming a buffer transistor, having a silicided gate and partially-silicided source/drain regions, wherein the silicided source/drain regions are not self-aligned with the gate; and, forming an ESD protection device, having a silicided gate and partially-silicided source/drain regions, wherein silicide on the source/drain regions is placed at a shorter distance from the gate than such regions in the buffer transistor.

2. The method of claim 1, further comprising the step of:
coupling the ESD protection device in parallel with the buffer transistor.

3. The method of claim 2, further comprising the step of:
forming active area resistance, and coupling such resistance in series between a source of the ESD event and the buffer transistor.

4. A method for forming an ESD protection device on a semiconductor substrate, for protecting a buffer transistor in a CMOS integrated circuit, comprising the steps of:

forming at least one transistor gate for the ESD protection device transistor in at least one active area of the semiconductor substrate;

forming at least one transistor gate for a buffer transistor device in at least one other active area of the semiconductor substrate;

forming transistor source/drain regions on both sides of each gate;

depositing an oxide layer over the entire substrate;

masking and etching the oxide layer to expose the source/drain regions, such that the length of remaining oxide between the unexposed ESD protection device transistor gate and the ESD protection device source/drain region is shorter than the length of remaining oxide between the exposed buffer transistor gate and the output/input buffer transistor source/drain regions;

forming silicide in the exposed regions;

forming an insulative layer over the substrate;

masking and etching the insulative layer to form vias, where electrically conductive connections are made to the silicided transistor source/drain regions;

forming conductors to connect a pad with the buffer transistor; and to connect the ESD protection device in parallel with the buffer transistor.

5. The method of claim 4, wherein active area resistance is formed between the buffer pad and the buffer transistor.

6. The method of claim 4, wherein the ratio of the length between the buffer transistor gate and the buffer transistor source/drain region to the length between the ESD protection device gate and the ESD protection device source/drain region is selected to provide protection from selected ESD events.

7. The method of claim 4, wherein the step of forming silicide comprises:

depositing a refractory metal over the substrate;

annealing, to form silicide on exposed regions; and, removing unreacted refractory metal.

8. The method of claim 7, wherein the refractory metal comprises titanium.

9. The method of claim 4, wherein the step of forming silicide comprises:

depositing a refractory silicide over the substrate; and, removing excess silicide.

10. The method of claim 9, wherein the refractory silicide comprises titanium silicide.

11. The method of claim 4, wherein the source/drain regions are n+ regions.

12. The method of claim 4, wherein the deposited oxide layer is a low-temperature oxide.

* * * * *